US009381735B2

(12) United States Patent
Sato et al.

(10) Patent No.: US 9,381,735 B2
(45) Date of Patent: Jul. 5, 2016

(54) PRINTING DEVICE

(75) Inventors: Hidetoshi Sato, Shizuoka (JP); Motoki Kobayashi, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 262 days.

(21) Appl. No.: 14/118,167

(22) PCT Filed: Dec. 14, 2011

(86) PCT No.: PCT/JP2011/006970
§ 371 (c)(1),
(2), (4) Date: Nov. 15, 2013

(87) PCT Pub. No.: WO2012/157032
PCT Pub. Date: Nov. 22, 2012

(65) Prior Publication Data
US 2014/0069285 A1 Mar. 13, 2014

(30) Foreign Application Priority Data

May 16, 2011 (JP) .................................. 2011-109333

(51) Int. Cl.
*B41F 15/36* (2006.01)
*B41F 15/34* (2006.01)
(Continued)

(52) U.S. Cl.
CPC ............. *B41F 15/34* (2013.01); *B41F 15/0881* (2013.01); *B41F 15/36* (2013.01); *B41F 15/423* (2013.01); *H05K 3/1216* (2013.01); *B41P 2215/112* (2013.01); *H05K 3/3484* (2013.01)

(58) Field of Classification Search
CPC .......... B41F 15/34; B41F 15/36; B41F 15/44; B41F 15/423; B41F 15/0881; H05K 3/1216; H05K 3/3484; B41P 2215/12
USPC .......................... 101/114, 123, 126, 129, 115
See application file for complete search history.

(56) References Cited

U.S. PATENT DOCUMENTS 4,068,579 A * 1/1978 Poo ..................... B41F 15/0872
101/124
4,254,707 A * 3/1981 Lambert ............. B41F 15/0818
101/123
(Continued)

FOREIGN PATENT DOCUMENTS

JP 08-207241 A 8/1996
JP 09-201940 A 8/1997
(Continued)

OTHER PUBLICATIONS

The extended European search report issued by the European Patent Office on Jun. 11, 2015, which corresponds to European Patent Application No. 11865727.9-1704 and is related to U.S. Appl. No. 14/118,167.
(Continued)

*Primary Examiner* — Blake A Tankersley
*Assistant Examiner* — Marissa Ferguson Samreth
(74) *Attorney, Agent, or Firm* — Studebaker & Brackett PC

(57) ABSTRACT

A printing device includes a mask raising/lowering mechanical part for raising/lowering, in a state of holding a screen mask, the screen mask in a vertical direction and positioning the screen mask relative to a substrate, a frame part disposed in a state of being independent from a raising/lowering operation of the screen mask, and a print head unit provided movably to the frame part and performing squeegeeing of the screen mask to which a solder has been supplied.

11 Claims, 12 Drawing Sheets

(51) Int. Cl.
*B41F 15/08* (2006.01)
*B41F 15/42* (2006.01)
*H05K 3/12* (2006.01)
*H05K 3/34* (2006.01)

(56) References Cited

U.S. PATENT DOCUMENTS

| | | | | |
|---|---|---|---|---|
| 4,814,523 A * | 3/1989 | Tanaka | ............... | C09K 19/3003 252/299.5 |
| 5,022,320 A * | 6/1991 | Szarka | ............... | B41F 15/0818 101/123 |
| 5,048,417 A * | 9/1991 | Everroad | ............... | G03F 7/12 101/123 |
| 5,239,923 A * | 8/1993 | Belcher | ............... | B41F 15/0818 101/115 |
| 5,713,277 A * | 2/1998 | Szarka | ............... | B41F 15/0818 101/123 |
| 2008/0121124 A1 * | 5/2008 | Sato | ............... | B41F 15/36 101/123 |
| 2009/0133595 A1 * | 5/2009 | Yamasaki | ............... | B41F 15/0813 101/127.1 |
| 2010/0313773 A1 | 12/2010 | Naoi et al. | | |

FOREIGN PATENT DOCUMENTS

| | | |
|---|---|---|
| JP | 10-086321 A | 4/1998 |
| JP | 2004-034529 A | 2/2004 |
| JP | 2005-153443 A | 6/2005 |
| JP | 2009-178882 A | 8/2009 |
| JP | 2010-280068 A | 12/2010 |
| JP | 2011-011534 A | 1/2011 |

OTHER PUBLICATIONS

International Search Report; PCT/JP2011/006970; Jan. 17, 2012.

* cited by examiner

PRINTING DEVICE

TECHNICAL FIELD

The present disclosure relates to a printing device including a mask raising/lowering mechanical part for raising and lowering a screen mask, and a print head unit for squeegeeing a screen mask.

BACKGROUND ART

Conventionally, a printing device including a printing device having a mask raising/lowering mechanical part for raising and lowering a screen mask, and a print head unit for squeegeeing a screen mask is known (for instance, refer to Japanese Patent Application Publication No. 2010-280068).

Patent Application Publication No. 2010-280068 discloses a screen printing machine for printing a solder paste, via a mask, on a work (object to be printed) fixed on a table. This screen printing machine is provided with a mask raising/lowering mechanical part for raising and lowering the held mask and positioning the mask in the height direction of the work relative to the table disposed at a predetermined height position. Moreover, on the mask raising/lowering mechanical part, a squeegee unit (print head unit) for applying a paste material supplied on a top face of the mask is mounted movably along the top face of the mask. Here, generally speaking, the squeegee unit is heavy since it includes a squeegee for wiping the paste material, a printing pressure load mechanical part for pressing the squeegee against the top face of the mask, and a movable mechanical part for performing squeegeeing by moving the squeegee and the printing pressure load mechanical part in a forward and a rearward direction.

Nevertheless, with the screen printing machine described in Japanese Patent Application Publication No. 2010-280068, since the heavy squeegee unit (print head unit) is directly mounted on the mask raising/lowering mechanical part, the squeegee unit itself also moves in the forward-rearward direction within the mask raising/lowering mechanical part together with the movement of the squeegee in the forward-rearward direction. In the foregoing case, the mask raising/lowering mechanical part may tilt in the forward-rearward direction (vertical direction) due to the movement of the squeegee unit. Thus, there is a problem in that the movement of the squeegee unit affects the height position accuracy of the mask raising/lowering mechanical part.

SUMMARY OF THE DISCLOSURE

An object of the present disclosure is to provide a printing device capable of inhibiting the height position accuracy of the mask raising/lowering mechanical part from being affected by the movement of the print head unit.

The printing device according to one aspect of the present disclosure for achieving the foregoing object includes a mask raising/lowering mechanical part for raising/lowering a screen mask while the screen mask is held in a vertical direction and positioning the screen mask relative to a substrate, a frame part disposed in a state of being independent from a raising/lowering operation of the screen mask, and a print head unit provided movably with respect to the frame part and performing squeegeeing of the screen mask to which a solder has been supplied.

The object, features and advantages of the present disclosure will become more apparent based on the ensuing detailed explanation and appended drawings.

DETAILED DESCRIPTION OF THE PREFERRED EMBODIMENTS

Embodiments of the present disclosure are now explained with reference to the drawings.

First Embodiment

Figure 1:
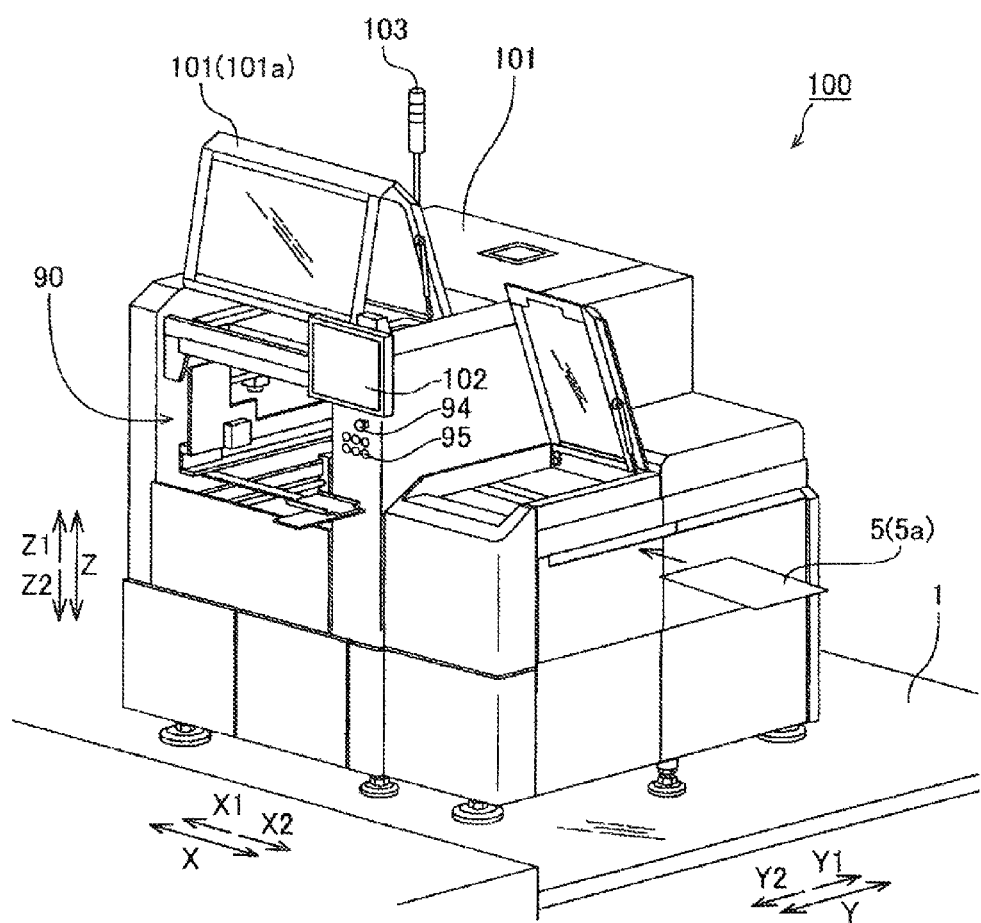
FIG. 1 is a perspective view showing the overall configuration of the printing device according to the first embodiment of the present disclosure.

The structure of the printing device 100 according to the first embodiment of the present disclosure is foremost explained with reference to FIG. 1 to FIG. 5. As shown in FIG. 1, the printing device 100 is a printing machine for mask-printing a solder paste on a top face 5a of a printed board (wiring substrate) 5 which is loaded into the device body. Note that the printed board 5 is an example of the "substrate" of the present disclosure.

Figure 2:
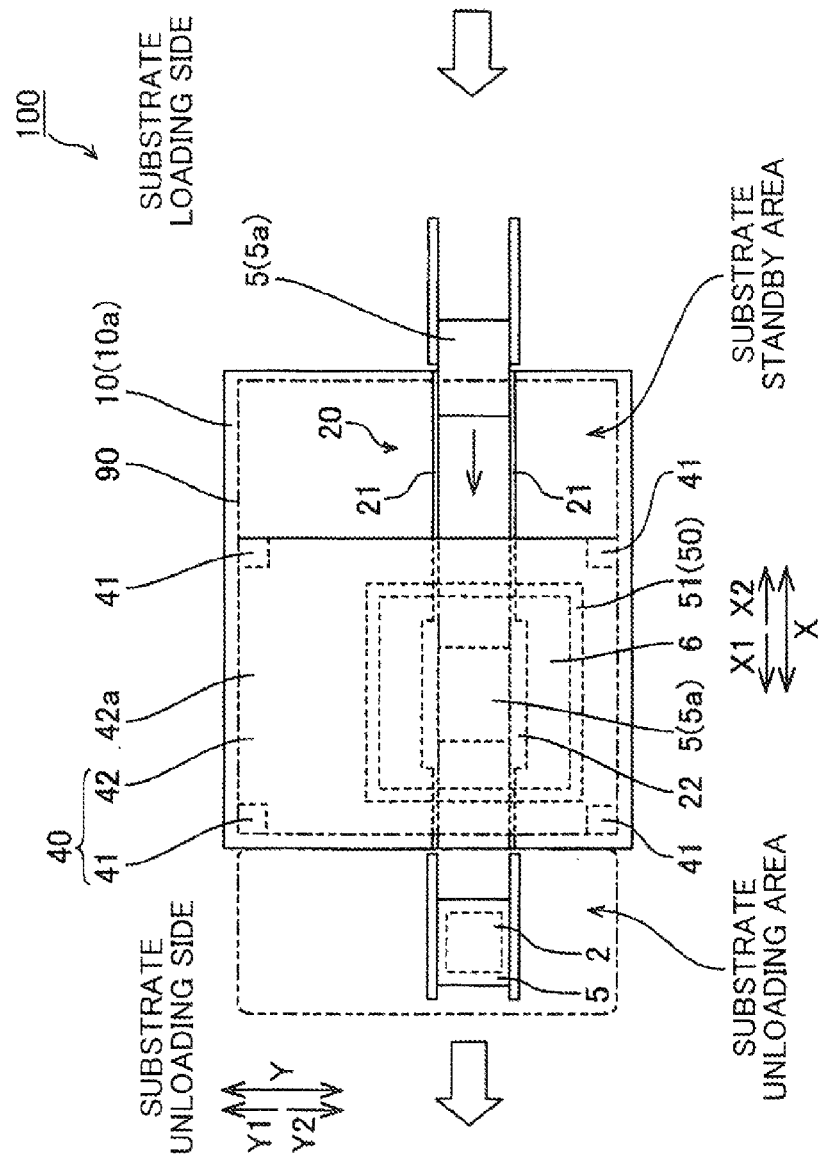
FIG. 2 is a plan view showing the schematic layout of the printing device according to the first embodiment.

The printing device 100 is installed on a floor face 1 (refer to FIG. 1) in an X-Y plane. In a planar view, as shown in FIG. 2, the printing device 100 includes one printing unit 90 (outer shape is indicated with a two-dot chain line) on a base 10. The printing unit 90 is disposed such that the longitudinal direction, which becomes the loading/unloading direction of the printed board 5, substantially coincides with the X direction of the base 10. Here, the loading direction of the printed board 5 in the printing unit 90 is the X direction, and the printing direction of the solder 2 (refer to FIG. 5) on the printed board 5 is the Y direction. Moreover, the X direction and the Y direction are directions that are mutually orthogonal on the base 10.

In the printing unit 90, the right side (X2 side) of FIG. 2 is the loading side of the printed board 5, and the left side (X1 side) of FIG. 2 is the unloading side of the printed board 5.

The area on the base 10 on the side that is more rightward than the frame structure 40 (top panel part 42) described later as being disposed on the right side of FIG. 2 is the standby area of the printed board 5, before printing. Moreover, the area on the side that is more leftward than the frame structure 40 (top panel part 42) disposed on the left side of FIG. 2 is the unloading area of the printed board 5 after printing. In addition, the area sandwiched between the standby area and the unloading area corresponds to the printing area of the printed board 5.

Figure 3:
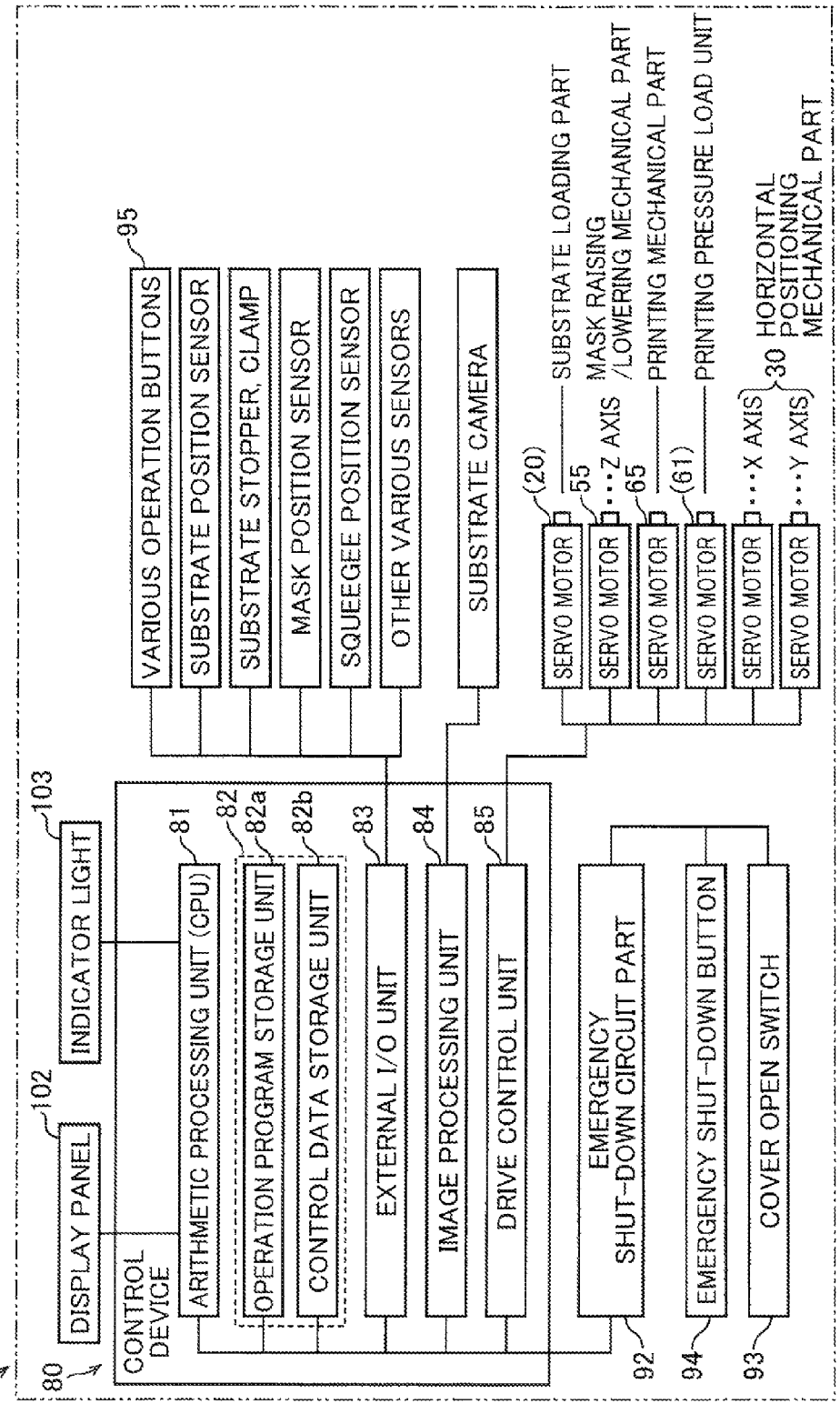
FIG. 3 is a block diagram showing the configuration of the printing unit configuring the printing device according to the first embodiment.
Figure 4:
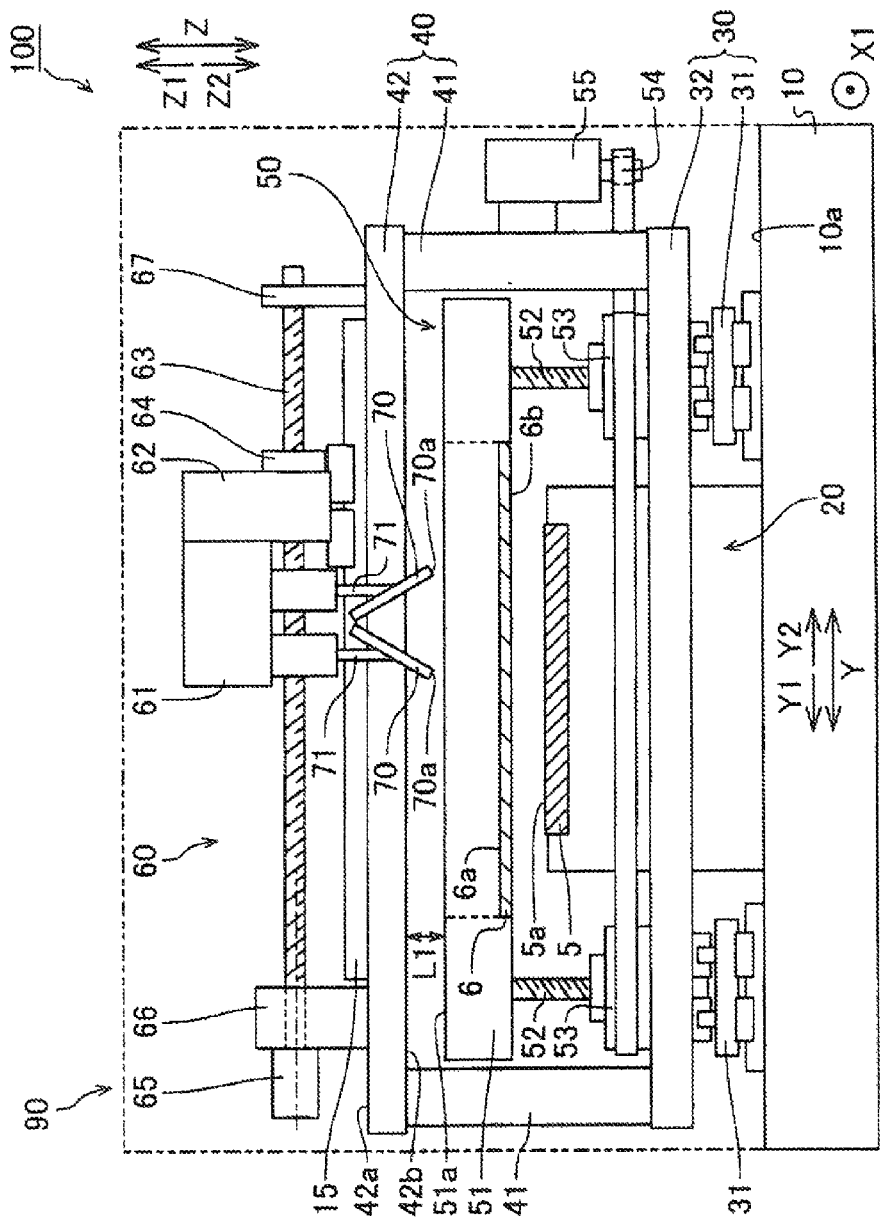
FIG. 4 is a side view upon viewing the printing unit in the printing device according to the first embodiment along the X1 direction.

When the printing unit 90 is viewed along the X direction in a state where the plurality of outer covers 101 (refer to FIG. 1) covering the printing device 100 are removed, as shown in FIG. 4, the printing unit 90 includes a substrate transport part 20 which is disposed on the base 10 and transports the printed board 5, a horizontal positioning mechanical part 30 which is disposed movably on the base 10 and on which the mask raising/lowering mechanical part 50, described later, is mounted, a frame structure 40 mounted on the horizontal positioning mechanical part 30, and a printing mechanical part 60 provided above (Z1 direction) of the mask raising/lowering mechanical part 50. Moreover, as shown in FIG. 3, the printing device 100 has a built-in control device 80, described later, for performing the operational control of the respective parts explained below. Note that the frame structure 40 is an example of the "frame part" of the present disclosure.

As shown in FIG. 2, the substrate transport part 20 has a function of transporting the printed board 5 before printing, which is disposed on the substrate loading side of the printing unit 90, to the printing area with a conveyer belt 21 which moves in the X1 direction, and has a function of transporting the printed board 5 after printing from the printing area to the unloading area. Here, the printing area refers to an area on the top face 5a of the printed board 5 where the screen mask 6 (refer to FIG. 4) is mounted during printing.

As shown in FIG. 4, the horizontal positioning mechanical part 30 includes a plurality of sliding mechanical parts 31, and a table 32 fixed to the upper side of the sliding mechanical part 31. The plurality of sliding mechanical parts 31 are disposed with a predetermined clearance in the Y direction across the area where the substrate transport part 20 is mounted on the base 10. The table 32 is supported by a pair of sliding mechanical parts 31 facing each other in the Y direction. Moreover, the horizontal positioning mechanical part 30 is provided with a drive mechanism (not shown) for driving the sliding mechanical part 31, and configured to enable the table 32 to move in the X-Y plane based on the foregoing drive mechanism. Note that, by individually driving the respective sliding mechanical parts 31, not only can the table 32 be moved parallel to the Y direction, the table 32 can also be slightly turned around the Z axis in the X-Y plane.

A frame structure 40 is mounted on a top face 32a of the table 32. As shown in FIG. 2, the frame structure 40 includes two pairs of leg parts 41 extending upward (normal direction of the sheet) from the vicinity of corners (four locations) of the table 32, and a top panel part 42 which connects the upper ends of the pairs of leg parts 41 in a horizontal direction in the X-Y plane. Here, the leg parts 41 are fixed to the top face 32a of the table 32 (refer to FIG. 4) with fastening members not shown. Consequently, the top panel part 42 covers the upper side of the substrate transport part 20 via the leg parts 41. Moreover, as shown in FIG. 4, when the printing unit 90 is viewed from the side along the X direction, the frame structure 40 is formed in a gate-shaped structure by the leg parts 41 and the top panel part 42. Note that the top panel part 42 is an example of the "support part" of the present disclosure. Note that, in FIG. 2, the illustration of the printing mechanical part 60 (refer to FIG. 4), described later, provided on a top face 42a of the top panel part 42 is omitted.

As shown in FIG. 4, the mask raising/lowering mechanical part 50 is disposed inside the frame structure 40 having the gate-shaped structure. Specifically, the mask raising/lowering mechanical part 50 includes a mask holding table 51 for holding the screen mask 6, four ball screw axes 52 extending downward (Z2 direction) from the mask holding table 51, pulleys 53 which are threadably mounted respectively on the four ball screw axes 52 and mounted rotatably without changing the position of the table 32 in the height direction on the top face 32a, a belt 54 provided for simultaneously rotating the four pulleys 53 in the same direction, and a servo motor 55 which is fixed to the leg parts 41 and drives the belt 54. Accordingly, the four pulleys 53 are rotated in the same direction pursuant to the rotation of the servo motor 55, and the four ball screw axes 52 which are threadably mounted on the pulleys 53 are simultaneously moved in the axial direction (Z direction). Consequently, the mask holding table 51 is raised/lowered along the vertical direction (Z direction) while maintaining its horizontal state.

In the first embodiment, the mask raising/lowering mechanical part 50 lowers the mask holding table 51 in the Z2 direction during printing, and causes the screen mask 6 held by the mask holding table 51 to come into contact with the top face 5a of the printed board 5 loaded in the printing area. After the printing, the mask raising/lowering mechanical part 50 raises the mask holding table 51 in the Z1 direction, and releases the screen mask 6 from the top face 5a of the printed board 5.

The frame structure 40 including the mask raising/lowering mechanical part 50 is mounted on the horizontal positioning mechanical part 30. As a result of the frame structure 40, the screen mask 6 held by the mask holding table 51 can be aligned precisely in the horizontal plane (in the X-Y plane) relative to the printed board 5 loaded in the printing area.

As shown in FIG. 4, a printing mechanical part 60 is provided on the top face 42a of the top panel part 42 in the frame structure 40. Here, the top face 42a of the top panel part 42 configures a horizontal plane as with the top face 10a of the base 10. The printing mechanical part 60 has a function of performing printing (squeegeeing) of the solder 2 (refer to FIG. 5) to the top face 5a of the printed board 5.

Figure 5:
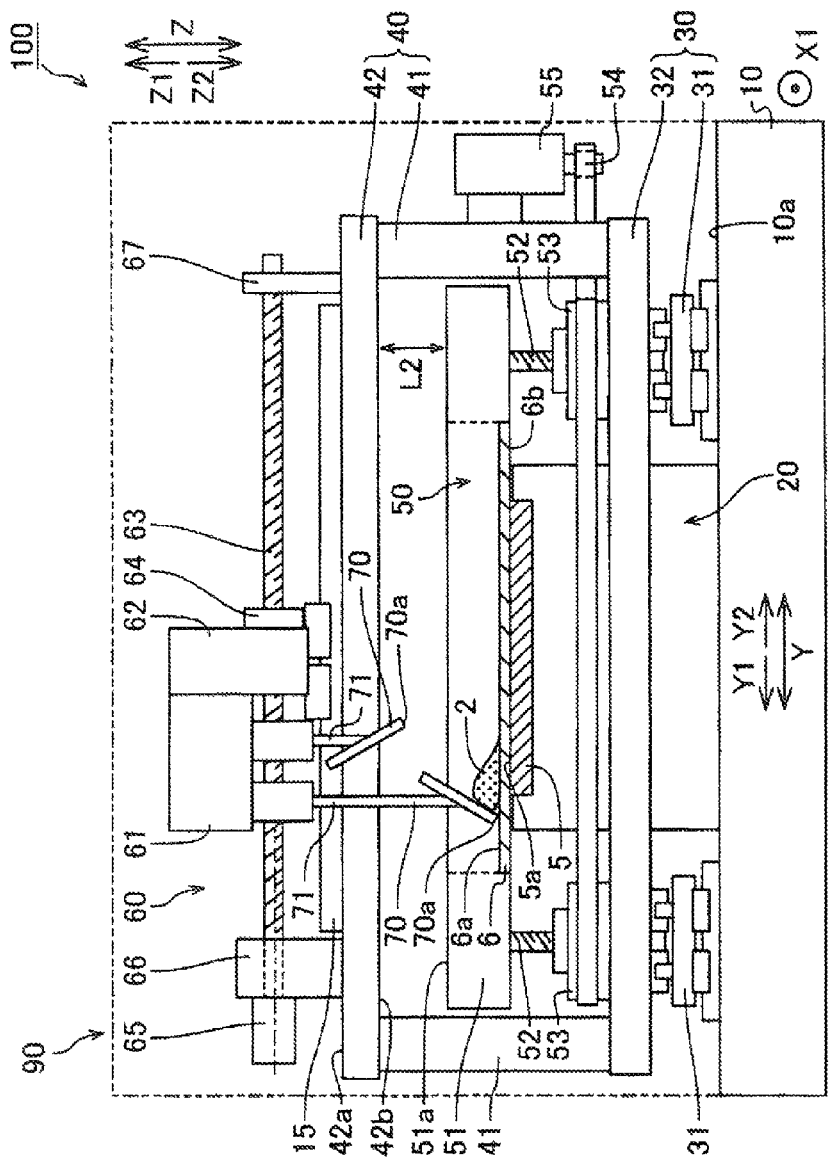
FIG. 5 is a side view showing the state immediately before starting squeegeeing upon viewing the printing unit in the printing device according to the first embodiment along the X1 direction.
Figure 6:
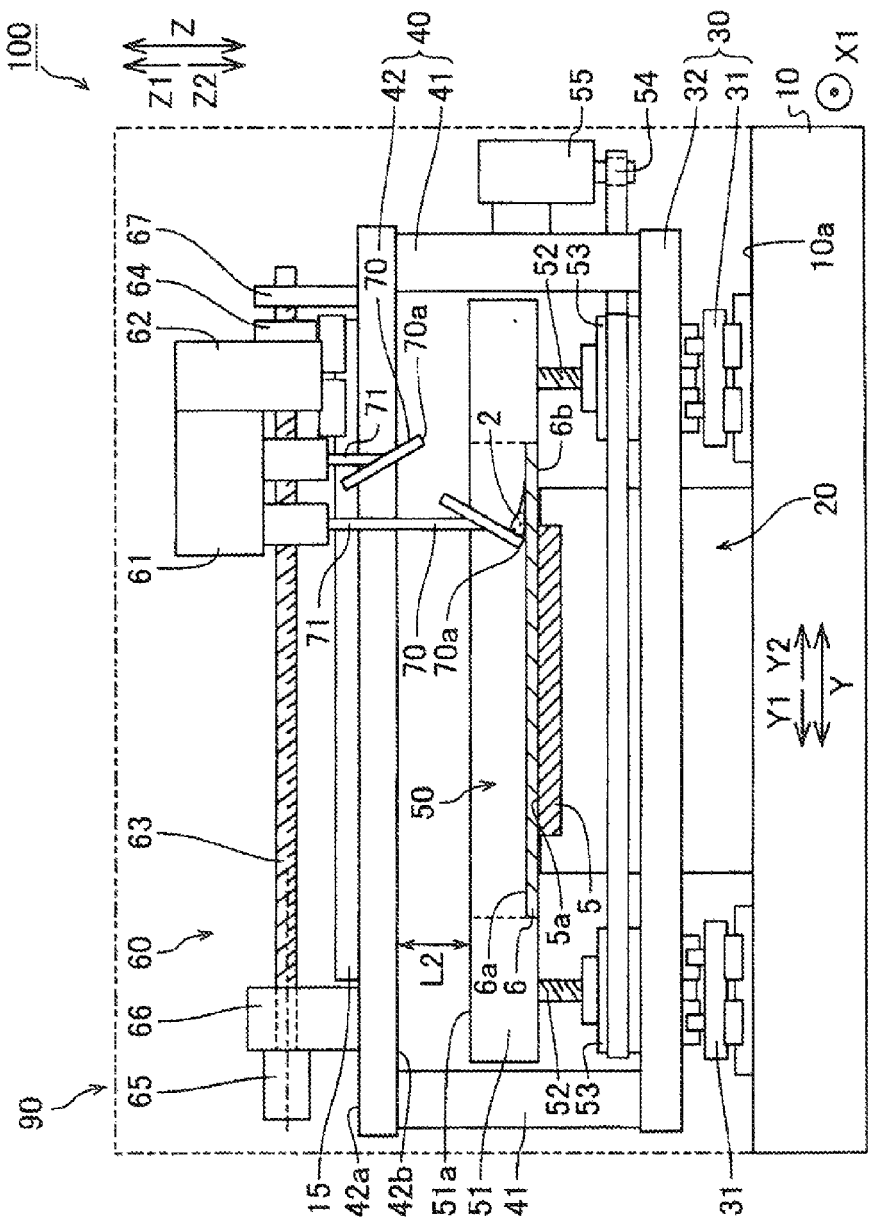
FIG. 6 is a side view showing the state immediately after completing squeegeeing in the foregoing printing device.

As shown in FIG. 5, the printing mechanical part 60 includes a printing pressure load unit 61 which slides in the Y direction while pressing the paste solder 2 against the top face 6a (Z1 side) of the screen mask 6, a solder supplying part 62 which is mounted on the printing pressure load unit 61 and supplies the solder 2 to the top face 6a of the screen mask 6, a ball screw axis 63 extending in the Y direction on the top face 42a, a nut member 64 which is threadably mounted on the ball screw axis 63 and fixed to the side of the solder supplying part 62, and a servo motor 65 for driving the ball screw axis 63. Here, with the ball screw axis 63, both ends, in the axial direction (Y direction), are rotatably fixed on the top face 42a by a fixing member 66 and a fixing member 67. Moreover, the servo motor 65 is fixed on the top face 42a by the fixing member 66.

A rail 15 extending in the Y direction is provided on the top face 42a of the top panel part 42. The rail 15 has a length that is longer than the length of the screen mask 6, in the Y direction, held by the mask holding table 51. In addition, the solder supplying part 62 on which the printing pressure load unit 61 is mounted is installed movably on the rail 15. Consequently, as a result of the rotation of the servo motor 65 the printing pressure load unit 61 moves relatively reciprocally along the printing direction (Y direction) relative to the screen mask 6.

A squeegee 70 which slides on the top face 6$a$ of the screen mask 6 is mounted on the printing pressure load unit 61 via an expandable/contractable rod 71. With the printing mechanical part 60, when printing is performed, a lower end 70$a$ of the squeegee 70 comes into contact with the screen mask 6 at a predetermined pressing force as a result of the rod 71 extending from the printing pressure load unit 61 being extended downward (Z2 direction). Note that a pair of squeegees 70 is provided to face each other in the Y direction, and the squeegee 70 which slides over the screen mask 6 is switched according to the printing direction (Y1 direction, Y2 direction). As a result of the printing pressure load unit 61 moving reciprocally in the printing direction (Y direction) relative to the mask holding table 51, the solder 2 is printed on the printed board 5. Note that the printing pressure load unit 61 is an example of the "print head unit" of the present disclosure, and the squeegee 70 is an example of the "spatula member" of the present disclosure.

Here, in the first embodiment, as shown in FIG. 4 and FIG. 5, the mask raising/lowering mechanical part 50 disposed inside the frame structure 40 and the printing mechanical part 60 disposed on the top panel part 42 of the frame structure 40 are structurally isolated and separated. In other words, the frame structure 40 (top panel part 42) is disposed in a state of being independent from the raising/lowering operation of the mask holding table 51 holding the screen mask 6 (that is, the raising/lowering operation of the screen mask 6), and the printing mechanical part 60 for performing squeegeeing is provided on the frame structure 40 (top panel part 42). Accordingly, even when the printing pressure load unit 61 of the printing mechanical part 60 moves in the printing direction (Y direction) on the top panel part 42, the weight of the printing pressure load unit 61 is not directly applied to the mask holding table 51 via the screen mask 6.

Moreover, the top panel part 42 is disposed with a clearance L1 above the top face 51$a$ of the mask holding table 51. Accordingly, even when the mask holding table 51 is raised to the uppermost position based on the raising/lowering operation of the mask raising/lowering mechanical part 50, a state where the top face 51$a$ is separated at a clearance L1 in the Z2 direction relative to the bottom face 42$b$ of the top panel part 42 is maintained. In addition, the mask raising/lowering mechanical part 50 raises/lowers the screen mask 6 held by the mask holding table 51 in a vertical direction, in a state of being independent from the top panel part 42, and thereby positions the screen mask 6 relative to the printed board 5.

Moreover, the printing mechanical part 60 is provided to the top panel part 42 of the frame structure 40. Thus, when the mask raising/lowering mechanical part 50 is moved in the horizontal direction (in the X-Y plane) by the horizontal positioning mechanical part 30, the printing pressure load unit 61 is also moved in the same direction as the moving direction of the mask raising/lowering mechanical part 50. In other words, since the printing pressure load unit 61 is also integrally moved in the X-Y plane in synchronization with the alignment of the screen mask 6 with the printed board 5 in the X-Y plane, the positional relation of the squeegee 70 relative to the screen mask 6 will never change. Here, the screen mask 6 and the squeegee 70 are disposed so that the lower end 70$a$ of the squeegee 70 extends in the X direction which is substantially orthogonal to one side of the screen mask 6 in the Y direction (printing direction). Accordingly, even when the frame structure 40 and the mask raising/lowering mechanical part 50 are moved in parallel in the X-Y plane or turned about the Z axis by the horizontal positioning mechanical part 30, it is possible to prevent a state where the squeegee 70 slides obliquely relative to the screen mask 6.

The mask raising/lowering mechanical part 50 is provided with a substrate camera (not shown) with the imaging lens thereof facing downward (Z2 direction). With the printing unit 90, a fiducial mark (alignment mark) (not shown) is appended to the top face 5$a$ of the printed board 5 and is detected by the substrate camera when the printed board 5 is transported in the X1 direction by the substrate transport part 20. Consequently, before the printing is started, the printed board 5 and the screen mask 6 transported to the printing area can be aligned accurately in the horizontal plane (in the X-Y plane).

The screen mask 6 (refer to FIG. 4) is configured from a plate-shaped (sheet-shaped) member having a thickness of approximately 20 μm or more and approximately 150 μm or less, and has an opening area where a plurality of openings (not shown) are patterned. Since the sheet-shaped screen mask 6 is flexible, the periphery of the screen mask 6 is fixed with the mask holding table 51 made from a highly rigid member.

The control device 80 is configured from a CPU (arithmetic processing unit) and a substrate circuit part. Specifically, as shown in FIG. 3, the control device 80 is mainly configured from an arithmetic processing unit 81, a storage unit 82, an external I/O unit 83, an image processing unit 84 and a drive control unit 85. Note that the drive control unit 85 is an example of the "control unit" of the present disclosure.

The arithmetic processing unit 81 is configured from a CPU, and governs the overall operation of the printing unit 90. Moreover, the control operation of the servo motor group is performed by the drive control unit 85 based on commands from the arithmetic processing unit 81.

The drive control unit 85 performs control of separating the squeegee 70 from the printed board 5 in the upward direction in synchronization with the operation of separating the screen mask 6 from the printed board 5 in the upward direction (Z1 direction). In other words, when the screen mask 6 is separated upward from the printed board 5 after the printing to the printed board 5 is completed from the state (refer to FIG. 5) in which the mask holding table 51 is lowered with a clearance L2 from the bottom face 42$b$ of the top panel part 42, the drive control unit 85 performs the operation of simultaneously lifting the rod 71 together with the raising of the mask holding table 51. Here, the drive control unit 85 lifts the rod 71 upward in a state where the lower end 70$a$ of the squeegee 70 is in contact with the top face 6$a$ of the screen mask 6 by finely controlling the printing pressure with the printing pressure load unit 61. Consequently, when the screen mask 6 is released from the printed board 5, the state where the squeegee 70 is in contact with the screen mask 6 at a predetermined pressing force is maintained. Accordingly, it is possible to inhibit the screen mask 6 from being released from the printed board 5 while flapping in the vertical direction.

The storage unit 82 includes an operation program storage unit 82$a$ storing control programs and the like that can be executed by the arithmetic processing unit 81, and a control data storage unit 82$b$ storing data and the like which are required upon performing the printing operation. Here, the operation program storage unit 82$a$ is configured from a flash ROM (Read Only Memory), and the control data storage unit 82$b$ is configured from a RAM (Random Access Memory).

The external I/O unit 83 has the function of controlling the I/O from various buttons, such as the operation start button 95, which are used for operational control, and various sensors such as a substrate position sensor, a mask position sensor, and a squeegee position sensor. The image processing unit 84 plays the role of processing image data that was captured by the substrate camera and internally generating data which is required for the operation of the printing unit 90.

The drive control unit 85 controls the various servo motors of the printing unit 90 based on the control signals output from the arithmetic processing unit 81. As the servo motors to be controlled, included are a servo motor for individually driving the sliding mechanical parts 31 of the horizontal positioning mechanical part 30, a servo motor 65 (refer to FIG. 4) for raising/lowering the mask holding table 51 in the Z direction, a servo motor 65 (refer to FIG. 4) for moving the printing pressure load unit 61 in the Y direction, a servo motor for raising/lowering the rod 71 in the printing pressure load unit 61, and a servo motor of a transport axis (not shown) provided for the substrate transport part 20. Moreover, the drive control unit 85 can recognize the position in the X-Y plane of the frame structure 40 (mask holding table 51), and the height position (Z direction) and the rotating position (about the Z axis) of the mask holding table 51 based on the signals from an encoder (not shown) of the respective servo motors.

The control device 80 is connected to an emergency shut-down circuit part 92 provided for the device body. Electrically connected to the emergency shut-down circuit part 92 are a cover open switch 93 provided at a predetermined position in the device body, and a push button-type emergency shut-down button 94. With the cover open switch 93, the opening and closing of the switch is switched according to the open/closed state of the access cover 101a (refer to FIG. 1). Consequently, in a state where the access cover 101a is open, the emergency shut-down circuit part 92 functions and the operation of the printing unit 90 is not started (resumed). Moreover, when, during the operation, the user presses the emergency shut-down button 94, the emergency shut-down circuit part 92 functions and the operation is instantaneously discontinued.

Moreover, as shown in FIG. 1, a display panel 102 is provided outside the printing device 100. The user can comprehend the progress of the printing operation via the respective display panels 102 and perform mechanical operations according to the contents displayed on the display panel 102. Moreover, the printing device 100 is provided with an indicator light 103. The indicator light 103 is disposed at a position that is higher than the upper surface part of the printing device 100, and the user can visually recognize the operation condition of the printing device 100 even from a location away from the printing device 100.

The printing operation of the printing device 100 according to the first embodiment of the present disclosure is now explained with reference to FIG. 2 to FIG. 8.

As shown in FIG. 2, let it be assumed that the printed board 5 before printing has been loaded to the standby position on the substrate transport part 20. When the printing operation in the printing unit 90 is continued, the conveyer belt 21 of the substrate transport part 20 is driven and the printed board 5 is transported to the printing area in the X1 direction.

Referring to FIG. 4, subsequently, the substrate camera (not shown) disposed on the mask raising/lowering mechanical part 50 detects a fiducial mark (not shown) appended to the top face 5a of the printed board 5. Subsequently, based on the fiducial mark of the printed board 5 detected by the substrate camera, the sliding mechanical part 31 of the horizontal positioning mechanical part 30 is driven and the printed board 5 and the mask holding table 51 are aligned in the X-Y plane. Consequently, the screen mask 6 is accurately overlapped at a predetermined position on the printed board 5.

In the foregoing state, the screen mask 6 held by the mask holding table 51 is lowered in the Z2 direction as a result of the servo motor 55 of the mask raising/lowering mechanical part 50 being driven. Consequently, the screen mask 6 is pressed against the top face 5a of the printed board 5 at a predetermined pressing force.

As shown in FIG. 5, the printing pressure load unit 61 is moved to a position near the end of the printing area on the Y1 side as a result of the servo motor 65 of the printing mechanical part 60 being driven. Subsequently, a predetermined amount of solder 2 is supplied by the solder supplying part 62 to the top face 6a of the screen mask 6. Thereafter, as a result of the rod 71 on the Y1 side of the printing pressure load unit 61 being extended downward, the lower end 70a of the squeegee 70 on the Y1 side comes into contact with the top face 6a of the screen mask 6 at a predetermined pressing force. In the foregoing state, as a result of the servo motor 65 being driven, the squeegee 70 is moved in the Y2 direction together with the printing pressure load unit 61, and squeegeeing (wiping operation of the paste solder 2) is performed. As a result of the squeegee 70 being moved to the position shown in FIG. 6, the solder 2 is printed, via the screen mask 6, on the top face 5a of the printed board 5. After the solder 2 has been printed, the screen mask 6 held by the mask holding table 51 is raised in the Z1 direction and released from the printed board 5 as a result of the servo motor 55 being driven.

Figure 7:
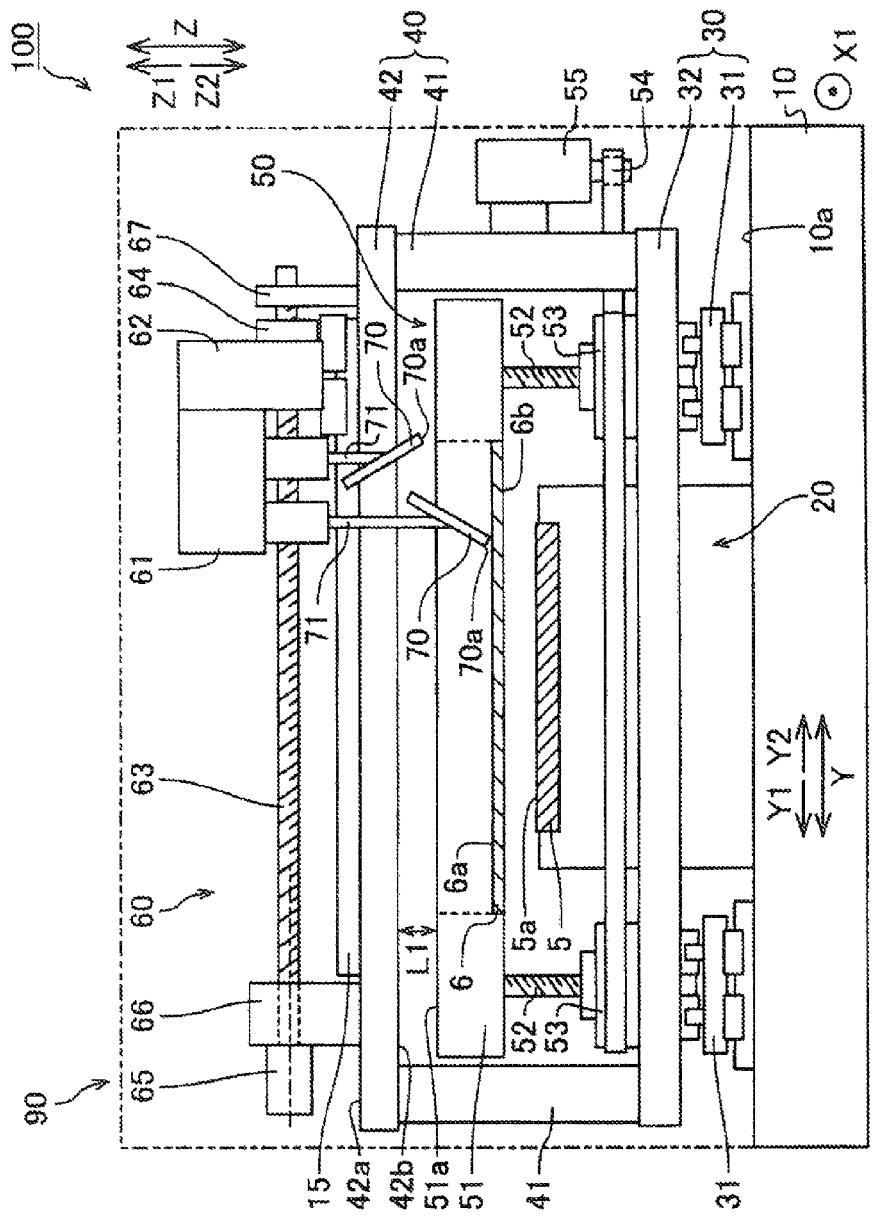
FIG. 7 is a side view upon the plate releasing operation in the foregoing printing device.
Figure 8:
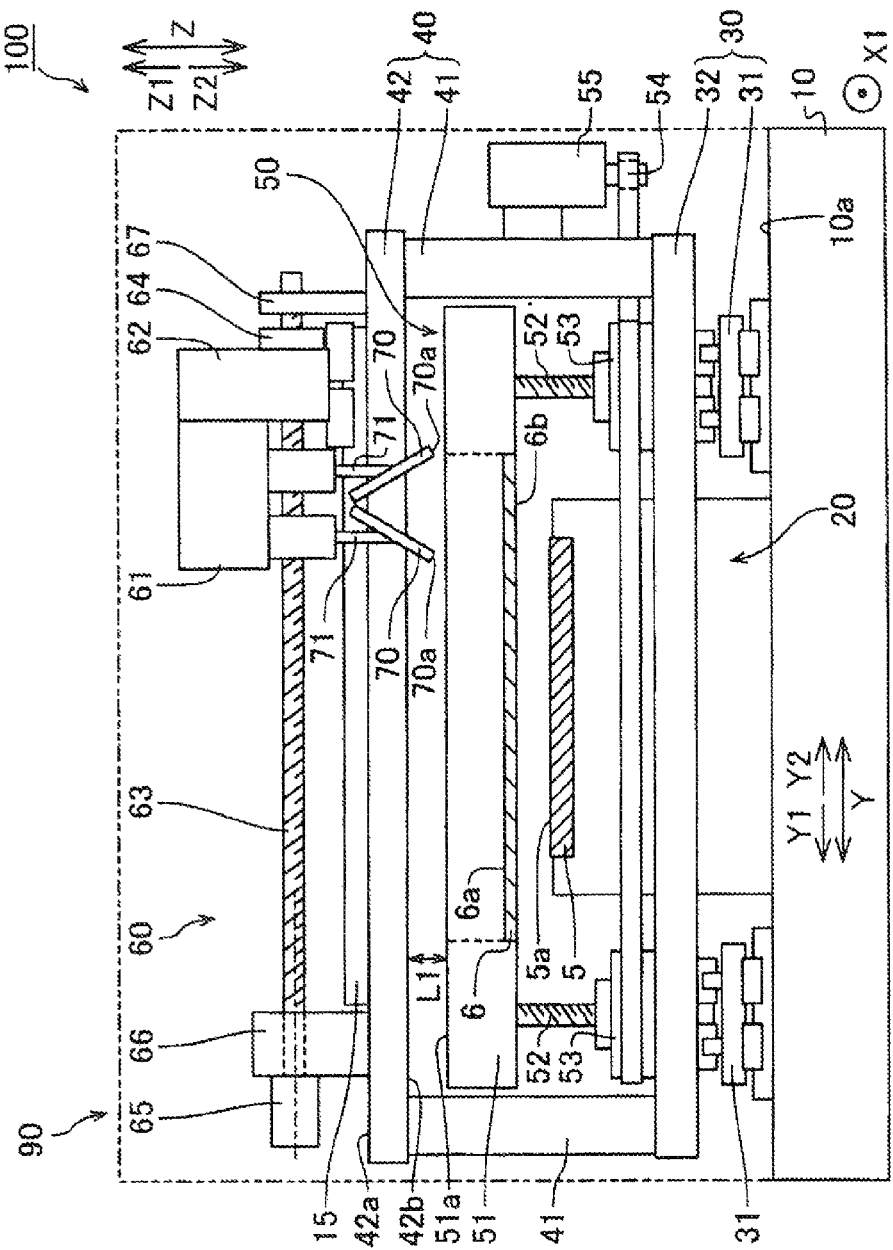
FIG. 8 is a side view upon housing the squeegee in the foregoing printing device.

Here, as shown in FIG. 7, the drive control unit 85 (refer to FIG. 3) performs the operation of lifting the squeegee 70 upward in synchronization with the operation of releasing the screen mask 6 from the printed board 5. In other words, by causing the speed of releasing the screen mask 6 (speed of raising the mask holding table 51) and the speed of raising the rod 71 (speed of raising the squeegee 70) to be substantially the same, the screen mask 6 and the squeegee 70 are both raised. Moreover, here, by controlling the printing pressure load by the printing pressure load unit 61, the rod 71 is lifted upward while causing the lower end 70a of the squeegee 70 to come into contact with the top face 6a of the screen mask 6. Note that the load upon raising the squeegee 70 (pressing force of the squeegee 70 against the screen mask 6) is controlled to be smaller than the printing pressure load upon performing squeegeeing. Subsequently, as shown in FIG. 8, the squeegee 70 is additionally lifted from the position where the raising of the mask holding table 51 has been stopped with a clearance L1 relative to the bottom face 42b of the top panel part 42.

Subsequently, as shown in FIG. 2, the conveyer belt 21 of the substrate transport part 20 is driven and the printed board 5, in which the printing is complete, is transported from the printing area to the unloading area in the X1 direction. With the printing unit 90, printing on the printed board 5 is continuously performed by repeating the foregoing printing operation.

Note that, with regard the printed board 5 to be printed subsequent to the printed board 5 explained above, in FIG. 8, by the rod 71 on the Y2 side of the printing pressure load unit 61 being extended downward, the squeegee 70 on the Y2 side comes into contact with the top face 6a of the screen mask 6 at a predetermined pressing force. After the solder 2 is supplied onto the top face 6a, the squeegee 70 on the Y2 side is moved in the Y1 direction, and squeegeeing is thereby performed. Subsequently, the squeegee 70 on the Y1 side and the squeegee 70 on the Y2 side are alternately switched in accordance with the printing direction, and the printing pressure load unit 61 is moved reciprocally to perform printing on the printed board 5.

As explained above, according to the first embodiment, the printing device 100 includes a frame structure 40 disposed in a state of being independent from the raising/lowering operation (Z direction) of the screen mask 6, and a printing mechanical part 60 including a printing pressure load unit 61 which is provided movably to the frame structure 40 in the Y direction and squeegees the screen mask 6 to which a solder 2 was supplied. Based on the foregoing configuration, even when the printing pressure load unit 61 of the printing mechanical part 60 is moved in the Y direction (printing direction) above the screen mask 6 during printing, since the printing mechanical part 60 is provided to the frame structure 40 that is structurally independent from the mask raising/lowering mechanical part 50 (mask holding table 51), it is possible to inhibit the load during the movement of the printing pressure load unit 61 from being directly applied to the mask raising/lowering mechanical part 50. Thus, even when the printing pressure load unit 61 is moved, it is possible to inhibit a situation where the mask holding table 51 tilts in a vertical direction due to the movement of the printing pressure load unit 61. As a result, it is possible to inhibit the height position accuracy of the mask raising/lowering mechanical part 50 (mask holding table 51) from being affected by the movement of the printing pressure load unit 61.

Moreover, the frame structure 40 includes a top panel part 42 which extends in a horizontal direction with a clearance above (Z1 direction) the mask raising/lowering mechanical part 50, and the printing mechanical part 60 including the printing pressure load unit 61 is supported movably in a horizontal direction by the top panel part 42. Consequently, when squeegeeing is performed, the printing pressure load unit 61 can be easily moved in the printing direction (Y direction) with the top panel part 42 provided independently above the mask holding table 51.

The mask raising/lowering mechanical part 50 is configured to raise/lower the screen mask 6 in the vertical direction and position the screen mask 6 relative to the printed board 5 in a state of being independent from the top panel part 42 of the frame structure 40. Consequently, even when the printing pressure load unit 61 moves the top panel part 42 in a horizontal direction pursuant to squeegeeing, since the top panel part 42 and the mask raising/lowering mechanical part 50 (mask holding table 51) are structurally independent from each other, it is possible to easily inhibit the load during the movement of the printing pressure load unit 61 from being directly applied to the mask holding table 51.

Moreover, the frame structure 40 further includes a leg part 41 which supports the top panel part 42 from below and extends in a vertical direction, and is formed in a gate-shaped structure by the leg part 41 and the top panel part 42. In addition, the mask raising/lowering mechanical part 50 is disposed inside the frame structure 40 having the gate-shaped structure. Consequently, the mask raising/lowering mechanical part 50 can be easily disposed inside the frame structure 40 having a gate-shaped structure. In addition, the printing pressure load unit 61 can be moved in a horizontal direction (printing direction) via the top panel part 42 to become a beam part of the gate-shaped structure having a predetermined rigidity. It is thereby possible to inhibit the height position accuracy of the mask raising/lowering mechanical part 50 from being affected by the movement of the printing pressure load unit 61.

The printing pressure load unit 61 is supported movably in a horizontal direction on a top face 42a side of the top panel part 42 in the frame structure 40. Consequently, space (clearance L1, L2) can be easily secured between the printing pressure load unit 61 and the mask holding table 51, which is below the top panel part 42. Accordingly, the printing pressure load unit 61 and the mask raising/lowering mechanical part 50 can be easily driven respectively in a mutually independent state.

In the first embodiment, the printing device 100 further includes a horizontal positioning mechanical part 30 for enabling the mask raising/lowering mechanical part 50 to move on the X-Y plane. The leg part 41 of the frame structure 40 is fixed to the horizontal positioning mechanical part 30. Consequently, since the mask raising/lowering mechanical part 50 can be moved in a horizontal direction while stably maintaining the height position accuracy of the mask raising/lowering mechanical part 50, the screen mask 6 can be aligned accurately relative to the printed board 5.

The printing pressure load unit 61 of the printing mechanical part 60 is configured to move pursuant to the movement of the mask raising/lowering mechanical part 50 in a horizontal direction (Y direction) by the horizontal positioning mechanical part 30. Consequently, in the horizontal direction, the printing pressure load unit 61 and the mask raising/lowering mechanical part 50 can be moved integrally. Accordingly, it is possible to inhibit, as much as possible, a deviation in the relative positional relation (positional relation about the Z axis) of the printing pressure load unit 61 and the mask raising/lowering mechanical part 50 in the horizontal plane (in the X-Y plane). Consequently, the printing pressure load unit 61 (squeegee 70) is inhibited from moving in an oblique direction relative to the appropriate squeegeeing direction (Y direction) of the screen mask 6 during the squeegeeing. Accordingly, the printing quality of the solder 2 to the printed board 5 can be favorably maintained.

Moreover, in the first embodiment, the printing device 100 further includes a drive control unit 85 for controlling the height position of the squeegee 70 during the movement of the screen mask 6 in a vertical direction by the mask raising/lowering mechanical part 50. The drive control unit 85 performs control of separating the squeegee 70 from the printed board 5 in synchronization with the operation of separating the screen mask 6 from the printed board 5 in a vertical direction. Consequently, even in cases where the printing mechanical part 60 is provided on the frame structure 40 which is structurally independent from the mask raising/lowering mechanical part 50, the movement of the squeegee 70 extending from the printing pressure load unit 61 can be appropriately controlled to be in synchronization with the movement of the screen mask 6 in the vertical direction by the mask raising/lowering mechanical part 50. Accordingly, the screen mask 6 can be easily released from the printed board 5 after printing.

The printing mechanical part 60 is configured to press the screen mask 6, at a predetermined pressing force, with the squeegee 70 when the squeegeeing is performed. The drive control unit 85 performs control of separating the squeegee 70 from the printed board 5, in a state where the squeegee 70 is in contact with the screen mask 6, when the screen mask 6 is separated from the printed board 5 by the mask raising/lowering mechanical part 50. Consequently, upon releasing the screen mask 6 from the printed board 5, the screen mask 6 can be released in a state of being in contact with the squeegee 70. Accordingly, it is possible to inhibit the screen mask 6 from being released from the printed board 5 while flapping in the vertical direction. Consequently, it is possible to inhibit the printing quality from deteriorating due to the inappropriate release of the screen mask 6.

Second Embodiment

Figure 9:
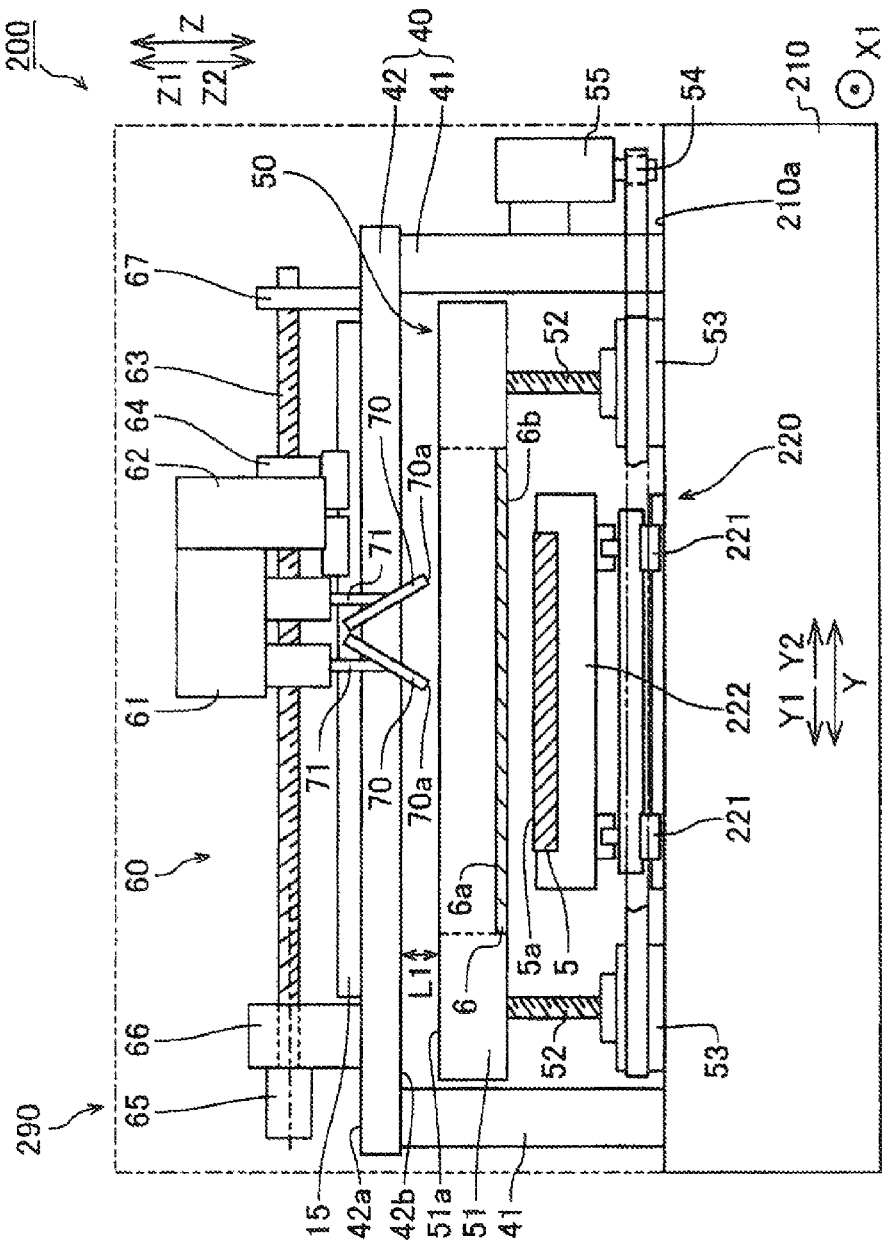
FIG. 9 is a side view upon viewing the printing unit in the printing device according to the second embodiment along the X1 direction.

The second embodiment is now explained with reference to FIG. 9. The printing device 200 according to the second embodiment is not provided with a horizontal positioning mechanical part 30 as in the first embodiment, and the frame structure 40 is directly fixed on the base 210. Note that the same configuration as the first embodiment in the diagram is illustrated by being given the same reference numeral as in the first embodiment. Note that the base 210 is an example of the "seating part" of the present disclosure.

The printing device 200 includes a printing unit 290 in which the mask raising/lowering mechanical part 50 is directly fixed to a top face 210*a* of the base 210. That is, the frame structure 40 provided with the mask raising/lowering mechanical part 50 is configured so that it will not move in the horizontal plane (in the X-Y plane). Accordingly, in the printing device 200, the substrate transport part 220 is configured to be movable in the horizontal plane (in the X-Y plane), and the printed board 5 and the screen mask 6 are thereby aligned in detail.

Specifically, the substrate transport part 220 includes a sliding mechanical part 221, and a substrate table 222 fixed to the upper side of the sliding mechanical part 221. A plurality of pins (not shown) extending upward from the top face (Z1 side) are mounted on the substrate table 222. The printed board 5 is mounted on the substrate table 222 in a state where the bottom face thereof is supported by the pins. Moreover, the substrate transport part 220 is provided with a drive mechanism not shown for driving the sliding mechanical part 221, and the substrate table 222 can move in the X-Y plane based on the drive mechanism.

Here, in the second embodiment also, the mask raising/lowering mechanical part 50 disposed in the frame structure 40 and the printing mechanical part 60 disposed on the top panel part 42 of the frame structure 40 are structurally isolated. Accordingly, even when the printing mechanical part 60 moves above the top panel part 42 in the printing direction (Y direction), the weight of the printing mechanical part 60 is not directly applied to the mask holding table 51.

Note that the remaining configuration of the printing device 200 is the same as the configuration of the printing device 100 in the first embodiment. Moreover, excluding the point that the alignment of the screen mask 6 held by the mask holding table 51 and the printed board 5 is performed on the side of the substrate transport part 220 before the printing is started, the printing operation of the printing device 200 is substantially the same as the printing operation of the printing device 100 in the first embodiment.

In the second embodiment, as explained above, the printing device 200 includes a base 210 on which the mask raising/lowering mechanical part 50 is fixedly mounted, and the leg part 41 of the frame structure 40 is fixed to the base 210. Thus, the printing device 200 capable of stably maintaining the height position accuracy of the mask raising/lowering mechanical part 50 can be obtained by a simple configuration. Note that the other effects of the second embodiment are the same as those of the first embodiment.

Third Embodiment

The third embodiment is now explained with reference to FIG. 3, FIG. 10 and FIG. 11. The printing device 300 according to the third embodiment includes two printing units 290 illustrated in the second embodiment. Note that in the diagram, the same configuration as the second embodiment is illustrated by being given the same reference numerals as in the second embodiment.

Figure 10:
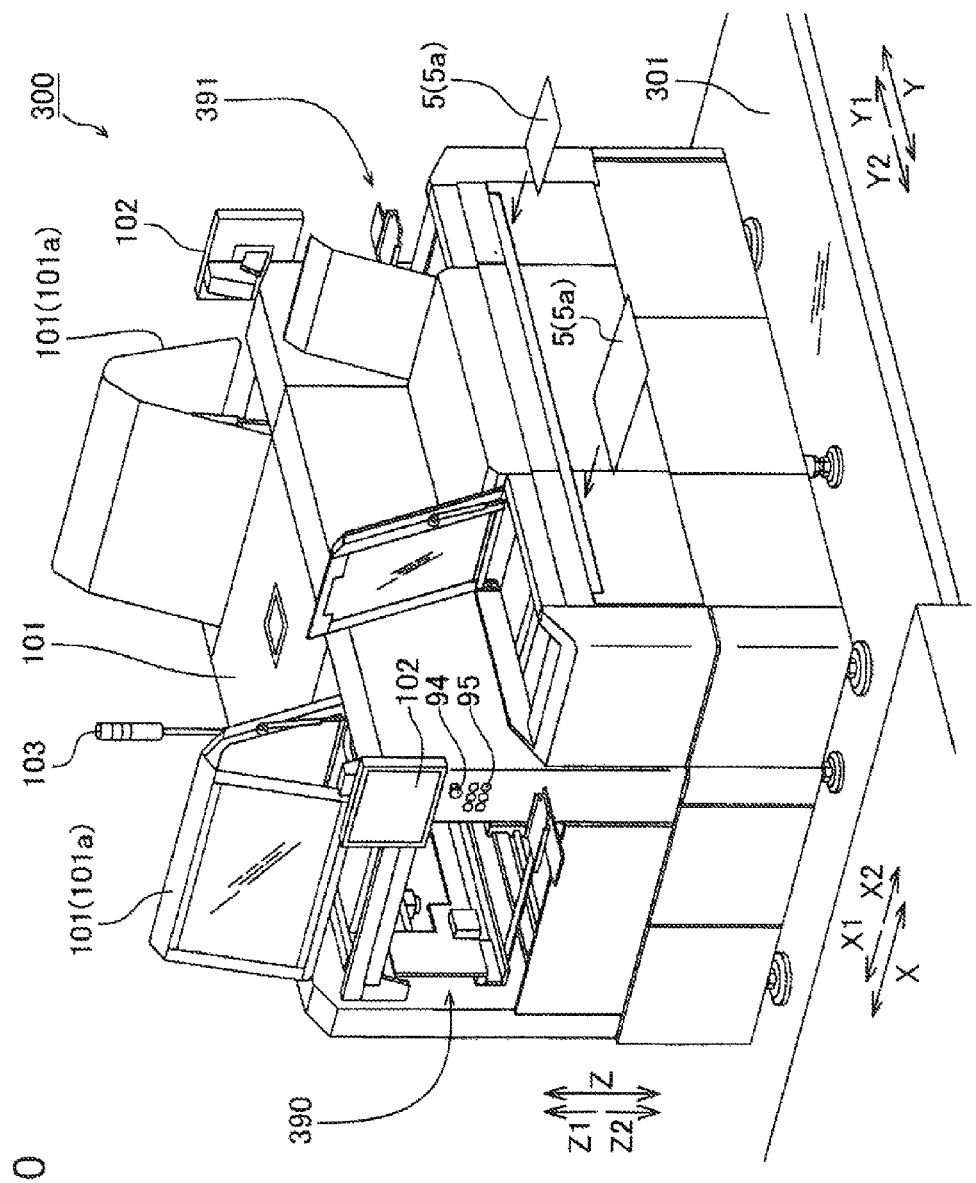
FIG. 10 is a perspective view showing the overall configuration of the printing device according to the third embodiment of the present disclosure.

As shown in FIG. 10, the printing device 300 includes two printing units 390 and 391, and, by individually driving the respective printing units, mask-printing is performed to the printed board 5 in the respective printing units. Here, the respective printing units can perform printing to printed boards 5 of mutually different sizes.

Figure 11:
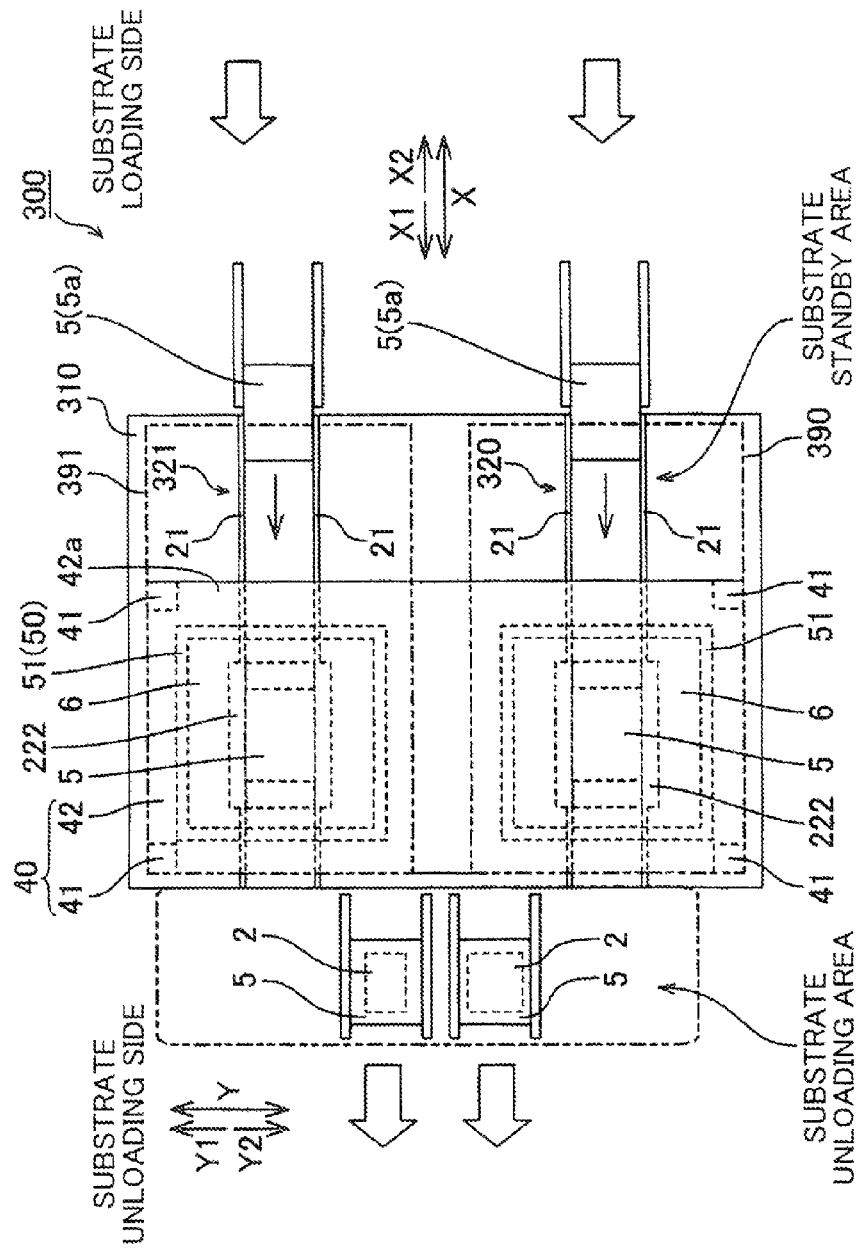
FIG. 11 is a plan view showing the schematic layout of the printing device according to the third embodiment.

In a planar view, as shown in FIG. 11, with the printing device 300, the two printing units 390 and 391 are aligned in the Y direction on the base 310 mounted on the floor face 301 (refer to FIG. 10). The printing units 390 and 391 are disposed such that the longitudinal direction, which becomes the loading/unloading direction of the printed board 5, substantially coincides with the X direction of the base 310.

The substrate transport part 320 of the printing unit 390 and the substrate transport part 321 of the printing unit 391 can mutually move in the Y direction to a position that is immediately below the mask raising/lowering mechanical part 50 of its counterpart. For example, the substrate table 222 of the substrate transport part 320 can move in the Y1 direction while holding the printed board 5 and be aligned with the mask raising/lowering mechanical part 50 of the printing unit 391 in the X-Y plane. Consequently, even in cases where the printing mechanical part 60 of the printing unit 390 is unable to perform printing for some reason, printing can be performed by using the mask raising/lowering mechanical part 50 and the printing mechanical part 60 of the printing unit 391. Accordingly, with the printing device 300, the printed board 5 loaded to one printing unit can be transferred to the other printing unit for printing.

The printing units 390 and 391 respectively include a control device 80 (refer to FIG. 3) which is substantially the same as the printing unit 290 illustrated in the second embodiment. The respective control devices 80 are connected to an integrated controller (main CPU) (not shown). The respective printing units are individually driven based on commands from the integrated controller. In addition, the operations of the respective printing units can also be driven by being mutually associated based on commands from the integrated controller. In other words, as described above, even in cases when the operation of the printing unit 390 (391) is stopped for some reason, the printed board 5 can be transferred to the other printing unit 391 (390) in order to continue the printing process. Note that the remaining configuration of the printing units 390 and 391 is substantially the same as the printing unit 290 illustrated in the second embodiment.

As described above, the printing device 300 includes two printing units 390 and 391 having a configuration that is substantially the same as the second embodiment. With this kind of printing device 300 also, it is possible to effectively inhibit the height position accuracy of the mask raising/lowering mechanical part 50 from being affected due to the movement of the printing pressure load unit 61 in the respective printing units. Note that the other effects of the third embodiment are the same as those of the first and second embodiments.

Note that the embodiments disclosed above are merely illustrative in all respects and should not be deemed to be limitative. The scope of the present disclosure is indicated based on the scope of claims, and not based on the explanation of the foregoing embodiments, and all modifications within the meaning and scope, which are equivalent to the scope of the claims, are covered by the present disclosure.

For example, in the first to third embodiments, while a case was explained where the mask raising/lowering mechanical part 50 was mounted on the table 32 of the horizontal positioning mechanical part 30 or the top face 210*a* of the base 210, the present disclosure is not limited thereto. For example, as a first modified example, the mask raising/lowering mechanical part 50 may also be mounted on the leg part 41 of the frame structure 40. In the foregoing case, the mask raising/lowering mechanical part 50 can be mounted by providing a support member or the like for supporting the mask holding table 51, in a manner that enables the raising/lowering thereof, to the side face of the leg part 41. Even with the configuration of this first modified example, the effects of the present disclosure can be obtained since the screen mask 6 can be raised/lowered in the vertical direction in a state where the mask holding table 51 is independent from the top panel part 42 of the frame structure 40.

Moreover, in the first to third embodiments, while a case was explained where the printing mechanical part 60 was mounted on the top panel part 42, the present disclosure is not limited thereto. For example, the printing mechanical part 60 can also be provided movably on the side of the bottom face 42*b* of the top panel part 42.

Figure 12:
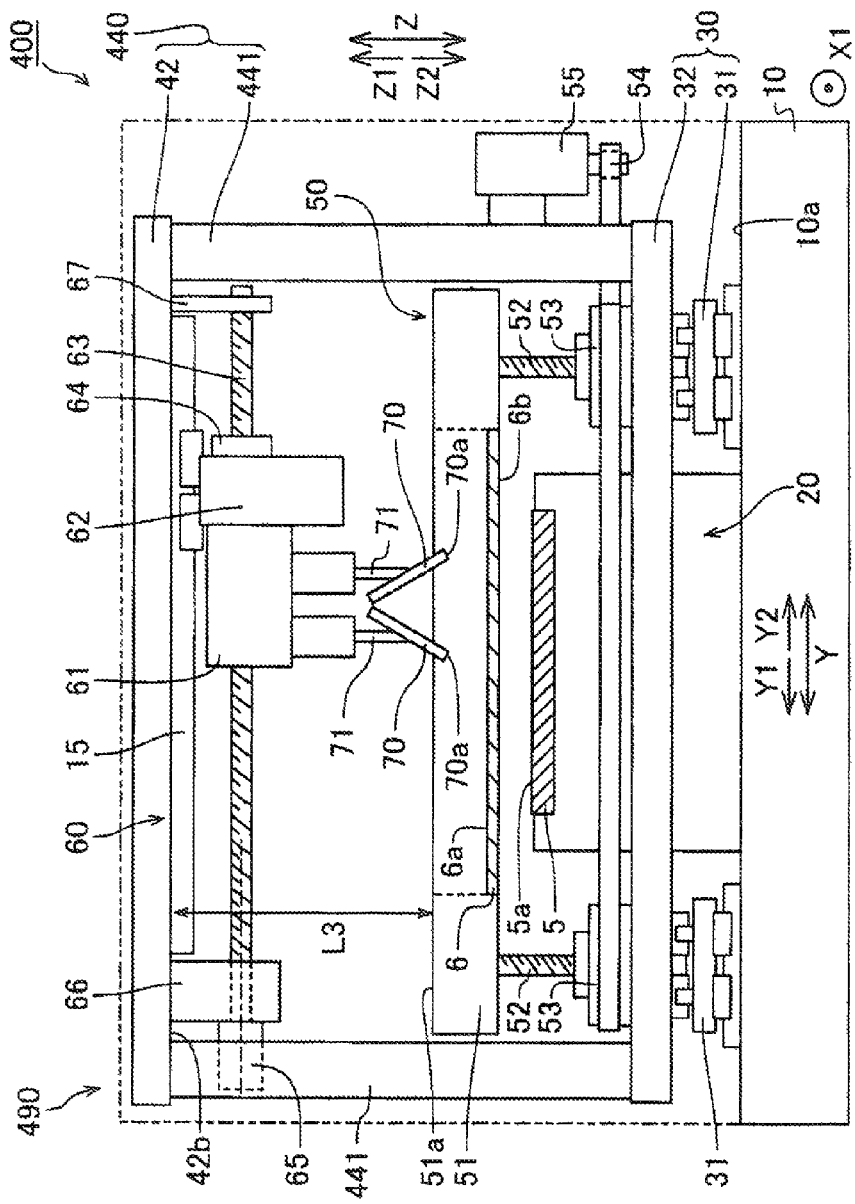
FIG. 12 is a side view upon viewing the printing unit in the printing device according to the second modified example of the present disclosure along the X1 direction.

Specifically, the printing device 400 can be illustrated as shown in a second modified example shown in FIG. 12. In the printing unit 490, the leg part 441 is extending more upward (Z1 direction) in comparison to the frame structure 40 of the first embodiment. In addition, the printing mechanical part 60 is movably suspended on the bottom face 42*b* of the top panel part 42 by using the space having a greater clearance L3 (L3>L2) between the mask holding table 51 and the top panel part 42. Even with the configuration of this second modified example, it is possible to prevent the weight of the printing pressure load unit 61 moving in the Y direction on the side of the bottom face 42*b* from being directly applied to the mask holding table 51 via the screen mask 6. In addition, the printing pressure load unit 61 and the mask holding table 51 can be disposed closer to each other in the vertical direction without having to interpose the top panel part 42. Accordingly, the operational control of the printing pressure load unit 61 (raising/lowering operation of the squeegee 70) associated with the raising/lowering operation of the screen mask 6 can be accurately performed while seeking the structural independence of the printing pressure load unit 61 and the mask raising/lowering mechanical part 50.

Moreover, in the first to third embodiments, while a case was explained where the printing pressure load unit 61 and the solder supplying part 62 of the printing mechanical part 60 were driven using the ball screw axis 63 and the nut member 64, which are driven by the servo motor 65, the present disclosure is not limited thereto. Instead of the ball screw axis and the nut member, for instance, the printing mechanical part 60 (printing pressure load unit 61 and solder supplying part 62) may also be driven by a drive mechanism such as a belt drive, a rack gear, or a pinion gear.

Moreover, in the first to third embodiments, while a case was explained where the solder 2 was printed on the printed board 5 based on the contact printing method of performing printing upon causing the printed board 5 and the screen mask 6 to be in close adhesion, the present disclosure is not limited thereto. The solder 2 can also be printed on the printed board 5 by providing a gap (space) between the printed board 5 and the screen mask 6 and applying the cap printing (off-contact printing) method of simultaneously performing the process of printing (squeegeeing) and plate releasing.

Moreover, in the first to third embodiments, while a case was explained where printing was performed on the printed board 5 via the squeezing of the solder 2 based on the open squeegee method using the squeegee 70, the present disclosure is not limited thereto. A cartridge head adopting the closed and pressured printing method with an improved filling performance of the solder 2 may also be applied to the "print head unit" of the present disclosure. Even in cases of performing squeegeeing to a screen mask using the cartridge head explained above, since the weight of the print head unit is not directly applied to the mask holding table 51, the height position accuracy of the mask holding table 51 can be appropriately maintained.

Note that the specific embodiments described above mainly include the disclosure configured as described below.

The printing device according to one aspect of the present disclosure includes: a mask raising/lowering mechanical part for raising/lowering, in a state of holding a screen mask, the screen mask in a vertical direction and positioning the screen mask relative to a substrate; a frame part disposed in a state of being independent from the raising/lowering operation of the screen mask; and a print head unit provided movably with respect to the frame part and performing squeegeeing of the screen mask to which solder has been supplied.

This printing device includes a frame part disposed in a state of being independent from the raising/lowering operation of the screen mask, and a print head unit which is provided movably with respect to the frame part and squeegees the screen mask to which solder was supplied. Consequently, even when the print head unit is moved above the screen mask during printing, since the print head unit is provided with respect to a frame part that is structurally independent from the mask raising/lowering mechanical part, it is possible to inhibit the load during the movement of the print head unit from being directly applied to the mask raising/lowering mechanical part. Thus, even when the print head unit is moved, it is possible to inhibit a situation where the mask raising/lowering mechanical part tilts in a vertical direction due to the movement of the print head unit. As a result, it is possible to inhibit the height position accuracy of the mask raising/lowering mechanical part from being affected by the movement of the print head unit.

In the printing device according to one aspect of the present disclosure, preferably, the frame part includes a support part extending in a horizontal direction above the mask raising/lowering mechanical part, with a clearance being formed between the support part and the raising/lowering mechanical part, and the print head unit is supported movably in a horizontal direction by the support part. According to the foregoing configuration, when squeegeeing is performed, the print head unit can be easily moved in a horizontal direction (printing direction) with the support part provided independently above the mask raising/lowering mechanical part.

In the configuration where the frame part includes the support part, preferably, the mask raising/lowering mechanical part is configured to raise/lower the screen mask in the vertical direction and position the screen mask relative to the substrate in a state of being independent from the support part of the frame part. According to the foregoing configuration, even when the print head unit moves the support part in a horizontal direction pursuant to squeegeeing, since the support part and the mask raising/lowering mechanical part are structurally independent from each other, it is possible to easily inhibit the load during the movement of the print head unit from being directly applied to the mask raising/lowering mechanical part.

In the configuration where the frame part includes the support part, preferably, the frame part further includes a leg part extending in a vertical direction, connected to the support part, and supporting the support part from below, the frame part is formed in a gate-shaped structure by the leg part and the support part, and the mask raising/lowering mechanical part is disposed inside the frame part having the gate-shaped structure. According to the foregoing configuration, the mask raising/lowering mechanical part can be easily disposed inside the frame part having a gate-shaped structure. In addition, the print head unit can be moved in a horizontal direction (printing direction) via the support part to become the beam part of the gate-shaped structure having predetermined rigidity. It is thereby possible to easily obtain a printing device in which the height position accuracy of the mask raising/lowering mechanical part is inhibited from being affected by the movement of the print head unit.

In the configuration where the frame part further includes the leg part connected to the support part, preferably, the printing device further includes a horizontal positioning mechanical part for enabling the mask raising/lowering mechanical part to move in a horizontal direction, and the leg part of the frame part is fixed to the horizontal positioning mechanical part. According to the foregoing configuration, since the mask raising/lowering mechanical part can be moved in a horizontal direction while stably maintaining the height position accuracy of the mask raising/lowering mechanical part, the screen mask can be aligned accurately relative to the substrate.

In the foregoing case, preferably, the print head unit is moved as a result of the movement of the mask raising/lowering mechanical part in a horizontal direction by the horizontal positioning mechanical part. According to the foregoing configuration, in the horizontal direction, the print head unit and the mask raising/lowering mechanical part can be moved integrally. Accordingly, it is possible to inhibit, as much as possible, a deviation in the relative positional relationship of the print head unit and the mask raising/lowering mechanical part in the horizontal plane. Since the print head unit is inhibited from moving in an oblique direction relative to the appropriate squeegeeing direction of the screen mask during the squeegeeing, the printing quality of the substrate can be favorably maintained.

In the configuration where the frame part further includes the leg part connected to the support part, preferably, the printing device further includes a seating part on which the mask raising/lowering mechanical part is fixedly mounted, and the leg part of the frame part is fixed to the seating part. According to the foregoing configuration, a printing device capable of stably maintaining the height position accuracy of the mask raising/lowering mechanical part can be obtained with a simple configuration.

In the configuration where the frame part includes the support part, preferably, the print head unit is supported movably in a horizontal direction on a top face side of the support part in the frame part. According to the foregoing configuration, since the print head unit is disposed on the top face side of the support part, space between the print head unit and the mask raising/lowering mechanical part, which is below the support part, can be easily secured. Consequently, the print head unit and the mask raising/lowering mechanical part can be easily driven respectively in a mutually independent state.

In the configuration where the frame part includes the support part, preferably, the print head unit is supported movably in a horizontal direction on a bottom face side of the support part in the frame part. According to the foregoing configuration, the print head unit and the mask raising/lowering mechanical part can be disposed closer to each other without having to interpose the support part. Accordingly, the operational control of the print head unit associated with the raising/lowering operation of the mask raising/lowering mechanical part can be accurately performed while seeking the structural independence of the print head unit and the mask raising/lowering mechanical part.

In the printing device according to one aspect of the present disclosure, preferably, the print head unit includes a spatula member for performing the squeegeeing, the printing device further including a control unit for controlling a height position of the spatula member during the movement of the screen mask in a vertical direction by the mask raising/lowering mechanical part, wherein the control unit performs control of separating the spatula member from the substrate in synchronization with the operation of separating the screen mask from the substrate in a vertical direction. According to the foregoing configuration, even in cases where the print head unit is provided to the frame part which is structurally independent from the mask raising/lowering mechanical part, the movement of the spatula member of the print head unit can be appropriately controlled to be in synchronization with the movement of the screen mask in the vertical direction by the mask raising/lowering mechanical part. Accordingly, the screen mask can be easily released from the printed board.

In the foregoing case, preferably, the print head unit presses the screen mask, at a predetermined pressing force, with the spatula member when the squeegeeing is performed, and the control unit performs control of separating the spatula member from the substrate in a state where the spatula member is in contact with the screen mask when the screen mask is separated from the substrate by the mask raising/lowering mechanical part. According to the foregoing configuration, upon releasing the screen mask from the substrate, the screen mask can be released in a state of being in contact with the spatula member. Accordingly, it is possible to inhibit the screen mask from being released from the printed board while flapping in the vertical direction. Consequently, it is possible to inhibit the printing quality from deteriorating due to the inappropriate release of the screen mask.

The invention claimed is:

1. A printing device, comprising:
a mask raising/lowering mechanical part for raising/lowering a screen mask while holding a screen mask, the screen mask in a vertical direction and positioning the screen mask relative to a substrate;
a frame part being independent from a raising/lowering operation of the screen mask;
a print head unit movably provided with respect to the frame part and the print head unit being configured to squeegee the screen mask in a first direction, a solder having been supplied to the screen mask; and
a horizontal positioning mechanical part enabling the mask raising/lowering mechanical part to move in a horizontal direction, wherein
the frame part includes a support part which extends horizontally in the first direction above the mask raising/lowering mechanical part, with a clearance formed between the support part and the mask raising/lowering mechanical part, and also includes a leg part extending in a vertical direction, connected to the support part and supporting the support part from below, and the frame part is formed in a gate-shaped structure by the leg part and the support part,
the print head unit is movably supported in the first direction by the support part,
the mask raising/lowering mechanical part is disposed inside the frame part having the gate-shaped structure, and wherein
the frame part is fixed to the horizontal positioning mechanical part.

2. The printing device according to claim 1,
wherein the mask raising/lowering mechanical part raises/lowers the screen mask in the vertical direction and positions the screen mask relative to the substrate independently from the support part of the frame part.

3. The printing device according to claim 1, wherein the leg part of the frame part is fixed to the horizontal positioning mechanical part.

4. The printing device according to claim 3,
wherein the print head unit is moved as a result of the movement of the mask raising/lowering mechanical part in a horizontal direction by the horizontal positioning mechanical part.

5. The printing device according to claim 1, further comprising:
a seating part on which the mask raising/lowering mechanical part is fixedly mounted, wherein
the leg part of the frame part is fixed to the seating part.

6. The printing device according to claim 1, wherein the print head unit is movably supported in a horizontal direction on a top face side of the support part in the frame part.

7. The printing device according to claim 1, wherein the print head unit is movably supported in a horizontal direction on a bottom face side of the support part in the frame part.

8. The printing device according to claim 1, wherein the print head unit includes a spatula member for performing squeegeeing,
the printing device further comprising a control unit for controlling a height position of the spatula member during the movement of the screen mask in a vertical direction by the mask raising/lowering mechanical part, and wherein
the control unit controls separation of the spatula member from the substrate in synchronization with separating the screen mask from the substrate in a vertical direction.

9. The printing device according to claim 8,
wherein the print head unit presses the screen mask, at a predetermined pressing force, with the spatula member when squeegeeing is performed, and
wherein the control unit controls separation of the spatula member from the substrate when the screen mask is separated from the substrate by the mask raising/lowering mechanical part.

10. The printing device according to claim 8,
wherein
the leg part of the frame part is fixed to the horizontal positioning mechanical part.

11. The printing device according to claim 10, wherein the print head unit is moved as a result of the movement of the mask raising/lowering mechanical part in a horizontal direction by the horizontal positioning mechanical part.

* * * * *